(12) United States Patent
Chen et al.

(10) Patent No.: US 7,696,578 B2
(45) Date of Patent: Apr. 13, 2010

(54) SELECTIVE CESL STRUCTURE FOR CMOS APPLICATION

(75) Inventors: Chia-Lin Chen, Jhubei (TW); Min-jan Chen, Hsinchu (TW); Jau-Jey Wang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 504 days.

(21) Appl. No.: 11/349,804

(22) Filed: Feb. 8, 2006

(65) Prior Publication Data

US 2007/0181951 A1    Aug. 9, 2007

(51) Int. Cl.
*H01L 27/092*    (2006.01)
(52) U.S. Cl. ................ 257/369; 257/E27.064
(58) Field of Classification Search ........ None
See application file for complete search history.

(56) References Cited

U.S. PATENT DOCUMENTS

| | | | |
|---|---|---|---|
| 5,399,387 A | 3/1995 | Law et al. | |
| 6,110,793 A | 8/2000 | Lee et al. | |
| 6,156,620 A | 12/2000 | Puchner et al. | |
| 6,316,302 B1 | 11/2001 | Cheek et al. | |
| 6,506,653 B1 | 1/2003 | Furukawa et al. | |
| 6,551,887 B2 | 4/2003 | Kwon et al. | |
| 6,573,172 B1* | 6/2003 | En et al. ............ | 438/626 |
| 6,764,911 B2 | 7/2004 | Hsu et al. | |
| 6,777,283 B2 | 8/2004 | Maeda | |
| 6,835,640 B2 | 12/2004 | Lee et al. | |
| 6,855,982 B1 | 2/2005 | Xiang et al. | |
| 6,890,808 B2 | 5/2005 | Chldambarrao et al. | |
| 6,977,408 B1* | 12/2005 | Lin et al. ........... | 257/315 |
| 6,991,991 B2 | 1/2006 | Cheng et al. | |
| 7,064,071 B2 | 6/2006 | Schwan | |
| 7,220,630 B2* | 5/2007 | Cheng et al. ........ | 438/199 |
| 7,396,718 B2* | 7/2008 | Frohberg et al. ..... | 438/233 |
| 7,482,219 B2* | 1/2009 | Frohberg et al. ..... | 438/224 |
| 7,485,515 B2* | 2/2009 | Chen et al. ......... | 438/195 |
| 2001/0041398 A1 | 11/2001 | Angello et al. | |
| 2002/0192868 A1 | 12/2002 | Kim | |
| 2003/0181005 A1* | 9/2003 | Hachimine et al. ... | 438/231 |
| 2004/0106267 A1 | 6/2004 | Beyer et al. | |
| 2004/0169269 A1 | 9/2004 | Yeo et al. | |
| 2004/0235236 A1* | 11/2004 | Hoffmann et al. .... | 438/231 |
| 2005/0074941 A1 | 4/2005 | Nagatomo | |
| 2005/0093078 A1* | 5/2005 | Chan et al. ......... | 257/374 |
| 2005/0142797 A1 | 6/2005 | Ahn | |

(Continued)

OTHER PUBLICATIONS

Chen, G., et al., "Dynamic NBTI of p-MOS Transistors and Its Impact on MOSFET Scaling," IEEE Electron Device Letters, vol. 23, No. 12, Dec. 2002, pp. 734-736.

(Continued)

*Primary Examiner*—Sue Purvis
*Assistant Examiner*—Benjamin P Sandvik
(74) *Attorney, Agent, or Firm*—Slater & Matsil, L.L.P.

(57) ABSTRACT

A PMOS device less affected by negative bias time instability (NBTI) and a method for forming the same are provided. The PMOS device includes a barrier layer over at least a portion of a gate structure, a gate spacer, and source/drain regions of a PMOS device. A stressed layer is then formed over the barrier layer. The barrier layer is preferably an oxide layer and is preferably not formed for NMOS devices.

9 Claims, 6 Drawing Sheets

U.S. PATENT DOCUMENTS

| | | |
|---|---|---|
| 2005/0151181 A1 | 7/2005 | Beintner et al. |
| 2005/0272213 A1 | 12/2005 | Wang et al. |
| 2006/0260827 A1 | 11/2006 | Clouston |

OTHER PUBLICATIONS

Scott, G., et al., "NMOS Drive Current Reduction Caused by Transistor Layout and Trench Isolation Induced Stress," 1999, pp. 34.4.1-34.4.4, 0-7803-5410-9/99, IEDM 99-827.

Ito, S., et al., "Mechanical Stress Effect of Etch-Stop Nitride and its Impact on Deep Submicron Transistor Design," 2000, pp. 10.7.1-10.7.4, 0-7803-6438-4/00, IEDM 00-247.

Shimizu, A., et al., "Local Mechanical-Stress Control (LMC): A New Technique for CMOS-Performance Enhancement," 2001, pp. 19.4.1-19.4.4, 0-7803-7050-3/01, IEDM 01-433.

Nara, Y., et al., "Process and Device Technologies for High-Performance 0.13 μm FCRAM," Jun. 2003, pp. 62-71, vol. 39, No. 1, Fujitsu Sci. Tech. J.

\* cited by examiner

SELECTIVE CESL STRUCTURE FOR CMOS APPLICATION

TECHNICAL FIELD

This invention relates generally to semiconductor devices, and more particularly to metal-oxide-semiconductor (MOS) devices, and even more particularly to the structure and manufacturing method of MOS devices having stressed channel regions.

BACKGROUND

The scaling of VLSI circuits is a constant effort. With circuits becoming smaller and faster, improvement in device drive current is becoming more important. When device dimensions are reduced to 130 nm and lower, particular 65 nm and lower, conventional methods for improving device drive current, such as shortening gate length and increasing gate capacitance, become difficult to implement. Further methods such as increasing carrier mobility have thus been explored.

Among efforts made to enhance carrier mobility, forming a stressed silicon channel is a known practice. Stress, sometimes referred to as strain, can enhance electron and hole mobility. The performance of a metal-oxide-semiconductor (MOS) device can be enhanced through a stressed-surface channel. This technique allows performance to be improved at a constant gate length, without adding complexity to circuit fabrication or design.

When silicon is placed under stress, the electron mobility is dramatically increased. Stress in a device may have components in three directions: parallel to the MOS device channel length, parallel to the device channel width, and perpendicular to the channel plane. The stress parallel to the device channel length and width are called in-plane strains. Research has revealed that a bi-axial, in-plane tensile stress field can improve NMOS performance, and compressive stress parallel to the channel length direction can improve PMOS device performance.

Stress can also be applied by forming a stressed capping layer, such as a stressed contact etch stop layer (CESL), on the MOS device. When a stressed CESL is deposited, the stress is imparted to the channel region. To achieve optimized performance, NMOS devices and PMOS devices preferably have a tensile-stressed CESL and a compressive-stressed CESL, respectively, although higher cost may be involved in forming stressed CESLs. FIG. 1 illustrates a cross-sectional view of this scheme. A PMOS device 2 has an overlying compressive-stressed CESL 6, and an NMOS device 4 has an overlying tensile-stressed CESL 8. The CESLs 6 and 8 are typically formed of silicon nitride ($Si_3N_4$) using different formation processes in order to generate different types of stresses.

PMOS devices formed using the conventional methods suffer reliability issues, however. The typical formation processes of $Si_3N_4$ generate hydrogen-containing by-products, which form bonds (Si—H) with silicon. These bonds may be broken later, generating interface traps at the interface of the gate oxide and silicon substrate, which causes a reliability issue called negative bias temperature instability (NBTI). NBTI results in a threshold voltage shift and a loss of drive current as a function of time. NBTI in PMOS devices has become one of the most critical reliability issues that ultimately determine the lifetime of integrated circuits.

Therefore, for future-generation integrated circuits, a fabrication method that solves the NBTI issue for PMOS devices is needed.

SUMMARY OF THE INVENTION

The preferred embodiment of the present invention provides a PMOS device less affected by negative bias time instability (NBTI) and a method for forming the same.

In accordance with one aspect of the present invention, a semiconductor structure includes a PMOS device comprising a gate structure over a substrate, a gate spacer on a sidewall of the gate structure, and a source/drain region substantially aligned with a side edge of the gate spacer. The semiconductor structure further includes a barrier layer over at least a portion of the gate structure, the gate spacer, and the source/drain region, and a stressed layer over the barrier layer. The barrier layer is preferably an oxide layer and the stress layer is preferably a contact etch stop layer formed of silicon nitride.

In accordance with another aspect of the present invention, the semiconductor structure further comprises an NMOS device comprising a gate structure over a substrate, a gate spacer on a sidewall of the gate structure, a source/drain region substantially aligned with a side edge of the gate spacer, and a stressed layer over the gate structure, the gate spacer, and the source/drain region. As NMOS devices suffer less from NBTI, the barrier layer that is formed for the PMOS device is preferably not formed for the NMOS device.

In accordance with yet another aspect of the present invention, the stressed layer over the NMOS device has a tensile stress and the stressed layer over the PMOS device has a compressive stress.

In accordance with yet another aspect of the present invention, the stressed layer over the NMOS device and the stressed layer over the PMOS both have a tensile stress and can be formed simultaneously.

In accordance with yet another aspect of the present invention, a method for forming the preferred embodiment of the present invention includes providing a substrate, forming a gate structure over the substrate, forming a gate spacer on a sidewall of the gate structure, forming a source/drain region comprising a p-type impurity, and forming a stressed layer over the gate structure, the gate spacer, and the source/drain region. For a PMOS device, the method preferably further includes forming a barrier layer underlying the stressed layer. Preferably no barrier layer is formed for an NMOS device. The stressed layer is preferably a contact etch stop layer.

Since the barrier layer prevents hydrogen from traveling through and forming bonds with silicon, no interface traps are formed when a negative bias is applied, and thus NBTI is reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of manufacturing a preferred embodiment of the present invention are illustrated in FIGS. 2 through 8. Variations of the preferred embodiments are then discussed. Throughout the various views and illustrative embodiments of the present invention, like reference numbers are used to designate like elements.

Figure 1:
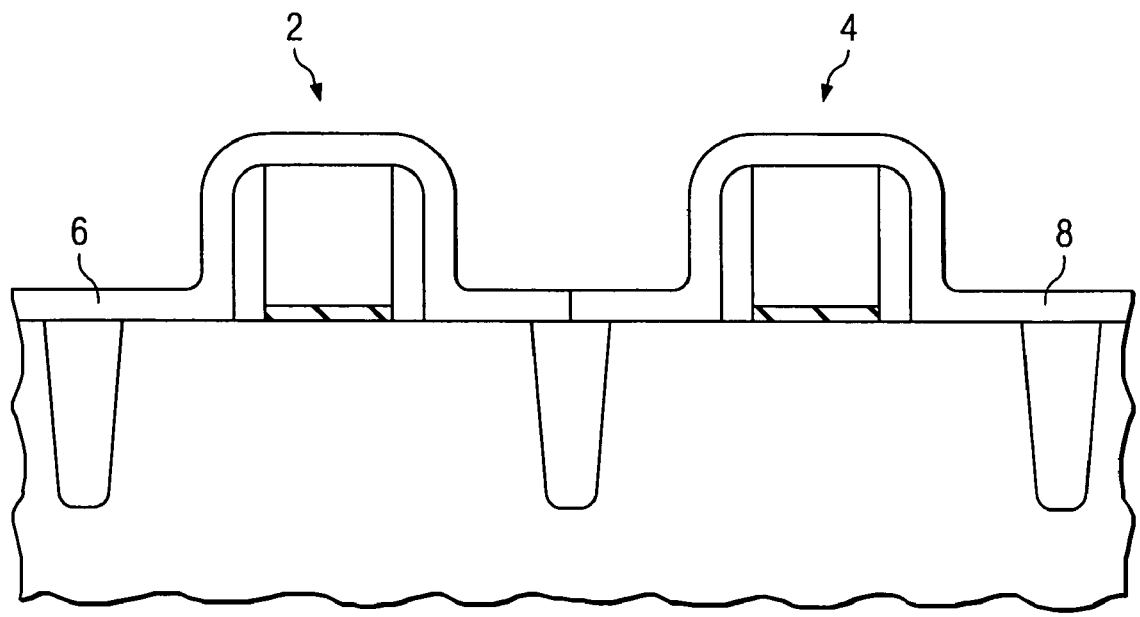
FIG. 1 illustrates a conventional semiconductor structure comprising a PMOS device and an NMOS device, wherein contact etch stop layers having compressive stress and tensile stress are formed for PMOS and NMOS devices, respectively.
Figure 2:
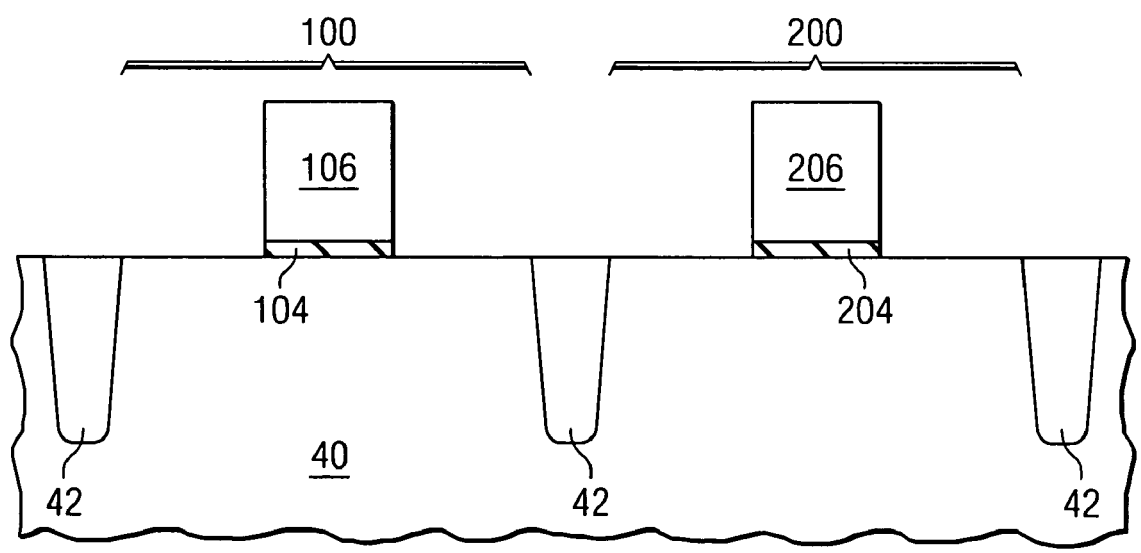
FIGS. 2 through 8 are cross-sectional views of intermediate stages in the manufacture of MOS device embodiments.

FIG. 2 illustrates gate stacks formed over a substrate 40 comprising two regions, a region 100 for forming a PMOS device and a region 200 for forming an NMOS device, which are isolated by shallow trench isolations (STI) 42 formed in the substrate 40. Preferably, the STIs 42 are formed by etching shallow trenches in substrate 40, and filling the trenches with an insulator such as silicon oxide.

In the preferred embodiment, substrate 40 is a silicon substrate. In other embodiments, bulk semiconductor, strained semiconductor, compound semiconductor, multi-layer semiconductor or silicon on insulator (SOI), strained silicon-on-insulator (SSOI), strained silicon germanium on insulator (S—SiGeOI), silicon germanium on insulator (SiGeOI), germanium on insulator (GeOI), and the like, can be used for substrate 40. An N-well region and a P-well region (not shown) are preferably formed in the regions 100 and 200, respectively.

A gate stack including a gate dielectric 104 and a gate electrode 106 is formed in the PMOS region 100. Similarly, a gate stack including a gate dielectric 204 and a gate electrode 206 is formed in the NMOS region 200. Preferably, in order to form the gate stacks, a gate dielectric layer is formed on the substrate 40, followed by a gate electrode layer. The gate dielectric layer and the gate electrode layer are then patterned, forming gate electrodes 106 and 206 and gate dielectrics 104 and 204 in regions 100 and 200, respectively. The gate dielectrics 104 and 204 are preferably formed of high-k materials, such as $HfO_X$, $HfSiO_X$, and the like. The gate electrodes 106 and 206 are preferably formed of polysilicon, although they may also be formed of metals, semiconductors, metal nitrides and/or silicides.

Figure 3:
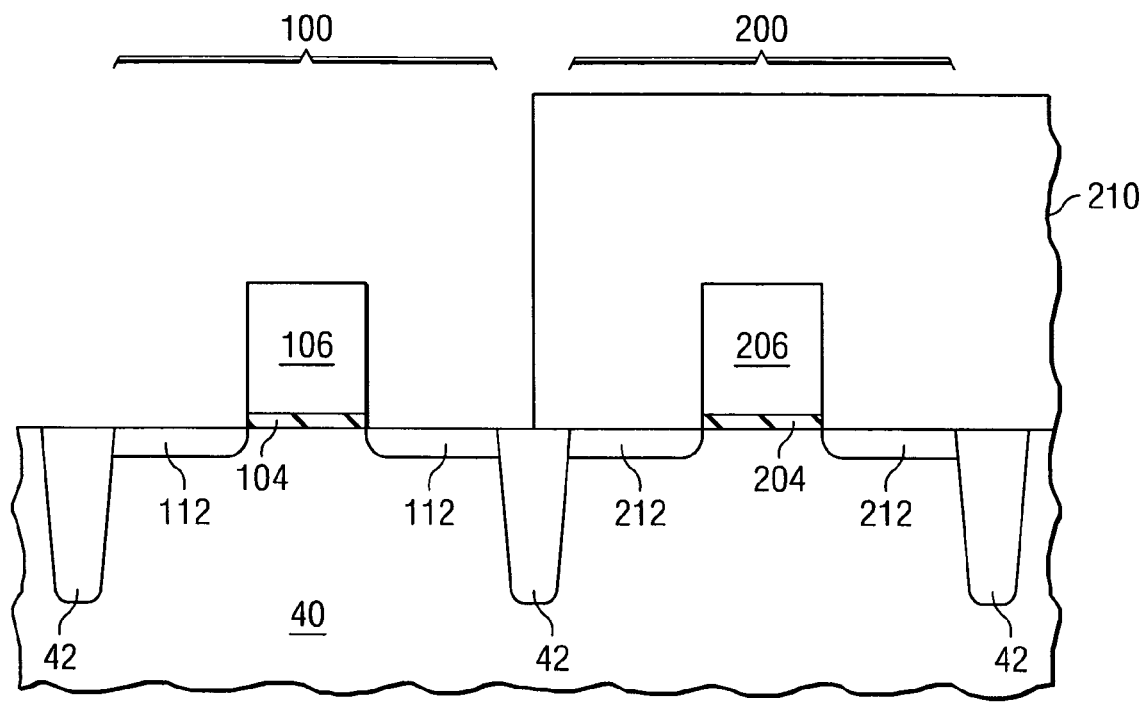

Referring to FIG. 3, lightly doped drain/source (LDD) regions 112 and 212 are preferably formed in the PMOS region 100 and NMOS region 200, respectively. To form the LDD region 112, a photo resist 210 is formed covering the NMOS region 200, and a p-type impurity is implanted. Masked by the gate electrode 106, LDD regions 112 are substantially aligned with the respective side edges of the gate electrode 106. Photo resist 210 is then removed. LDD regions 212 are similarly formed by masking the PMOS region 100 with a photo resist (not shown), and implanting an n-type impurity.

Figure 4:
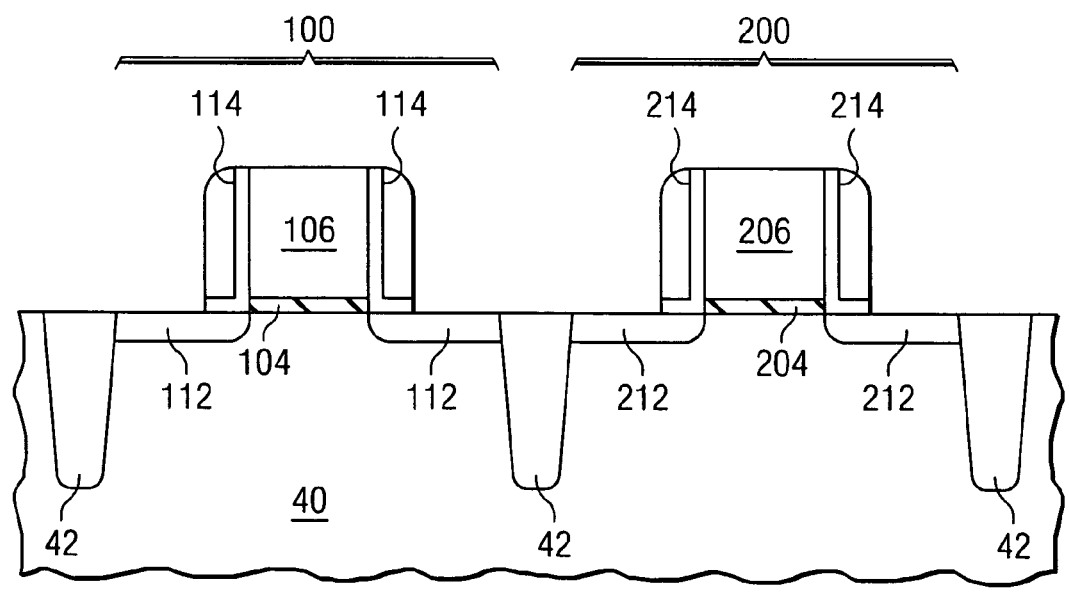

FIG. 4 illustrates the formation of spacers 114 and 214. As is known in the art, spacers 114 and 214 are preferably formed by blanket depositing a dielectric layer(s) over an entire region and anisotropically etching to remove the dielectric layer from horizontal surfaces, thus leaving spacers 114 and 214.

Figure 5A:
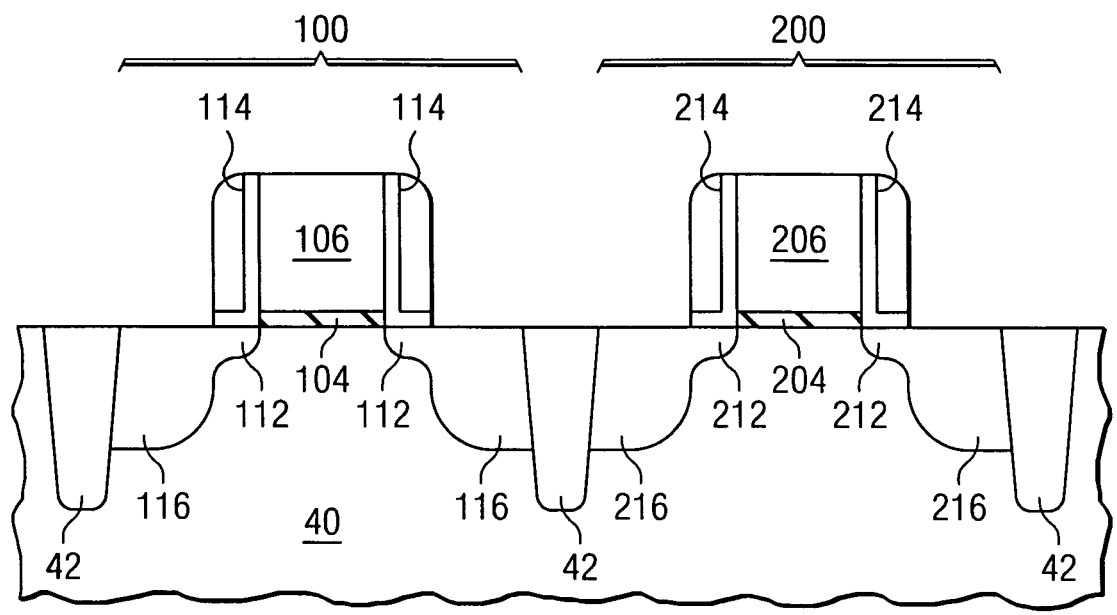
Figure 5B:
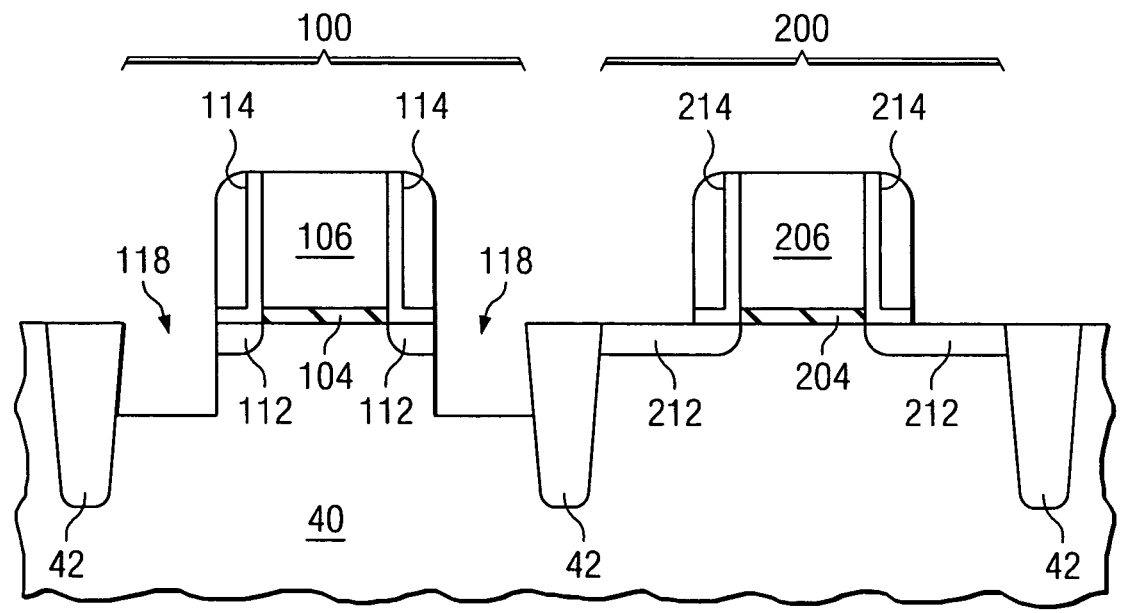
Figure 5C:
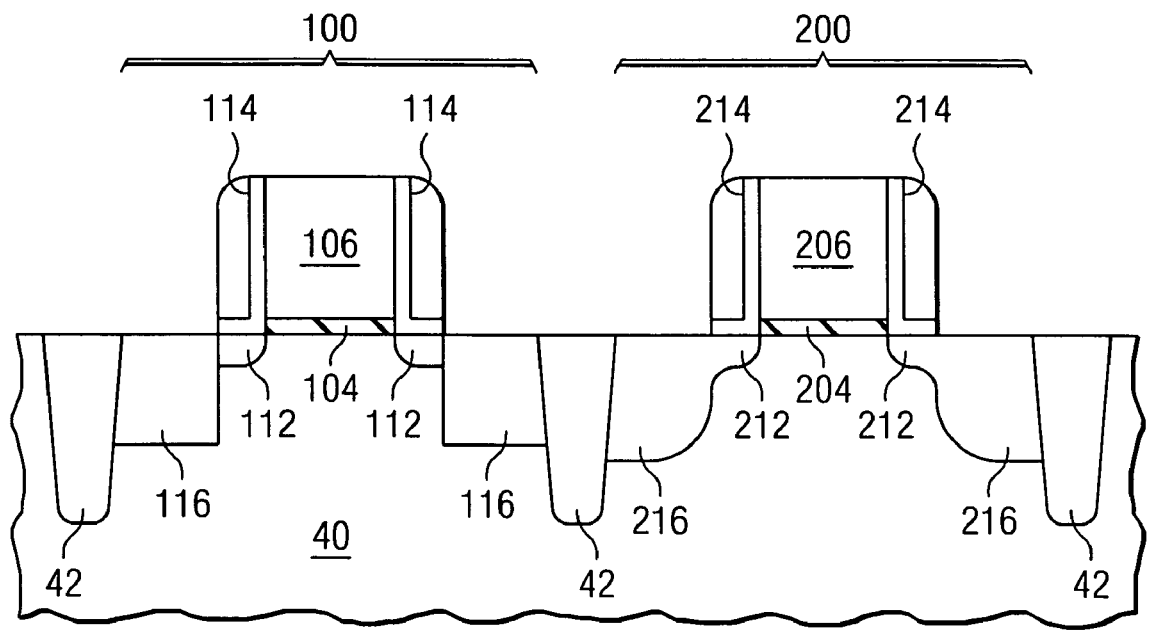

FIGS. 5A through 5C illustrate the formation of source/drain regions 116 and 216. In the preferred embodiment, as shown in FIG. 5A, the formation of the source/drain regions 116 includes masking the region 200, and implanting p-type impurities into the semiconductor substrate 40. Edges of the source/drain regions 116 are substantially aligned with the spacer 114. Source/drain regions 216 are preferably implanted with n-type impurities when region 100 is masked. Gate electrodes 106 and 206 are preferably implanted to reduce sheet resistance.

In alternative embodiments, as shown in FIGS. 5B and 5C, the source/drain regions 116 of the PMOS device comprise SiGe regions. In FIG. 5B, recesses 118 are formed in PMOS region 100, preferably by anisotropically etching the substrate 40. A material having a lattice constant substantially greater than that of the substrate 40, for example, SiGe, is epitaxially grown in the recesses 118, forming source/drain regions 116, as shown in FIG. 5C. P-type impurities are simultaneously doped into the SiGe regions 116 when they are grown. Source/drain regions 216 of the NMOS device are preferably formed by implanting, although other commonly used methods can also be used.

Figure 6:
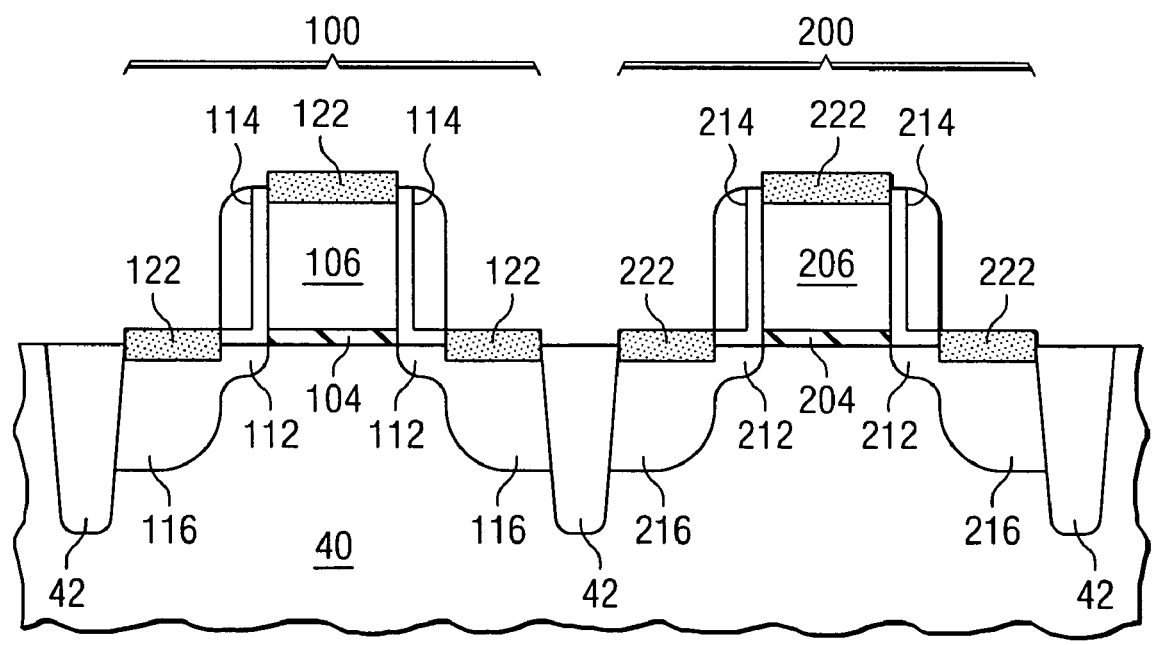

FIG. 6 illustrates the formation of silicide regions 122 and 222 using a salicide process. The silicide regions 122 and 222 preferably comprise $NiSi_2$, $CoSi_2$, $TiSi_2$, and the like. To form a silicide layer, a thin layer of metal such as cobalt, nickel, titanium, or the like is preferably deposited over the device. The device is then annealed to form a silicide layer between the deposited metal and the underlying silicon regions. Un-reacted metal is then removed.

Figure 7A:
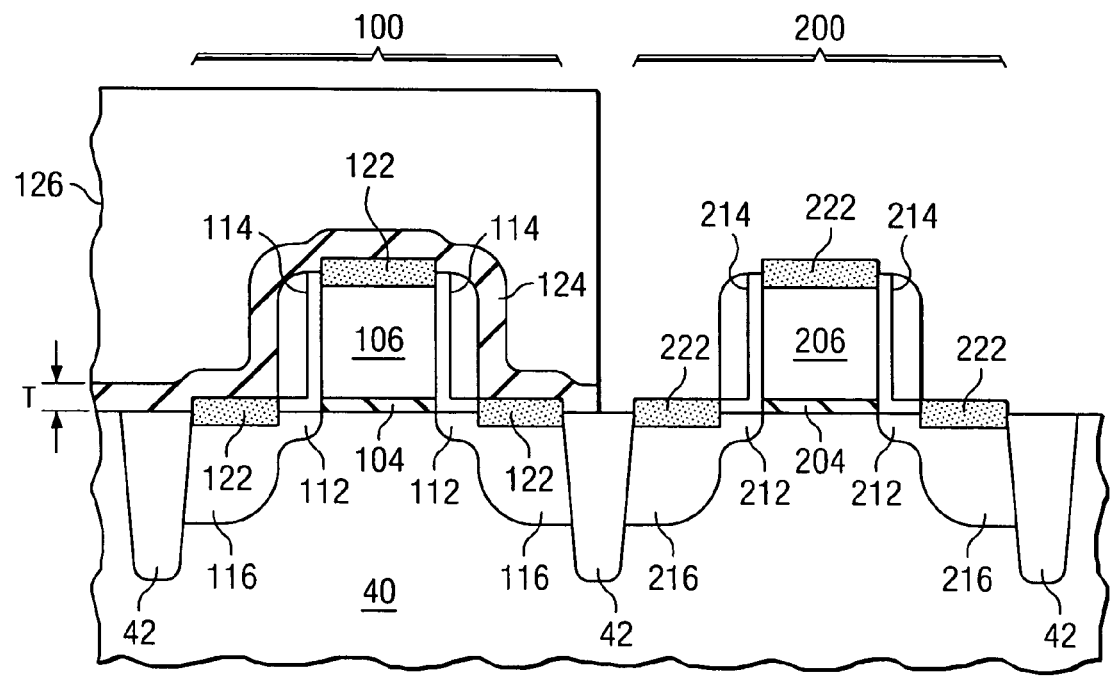
Figure 7B:
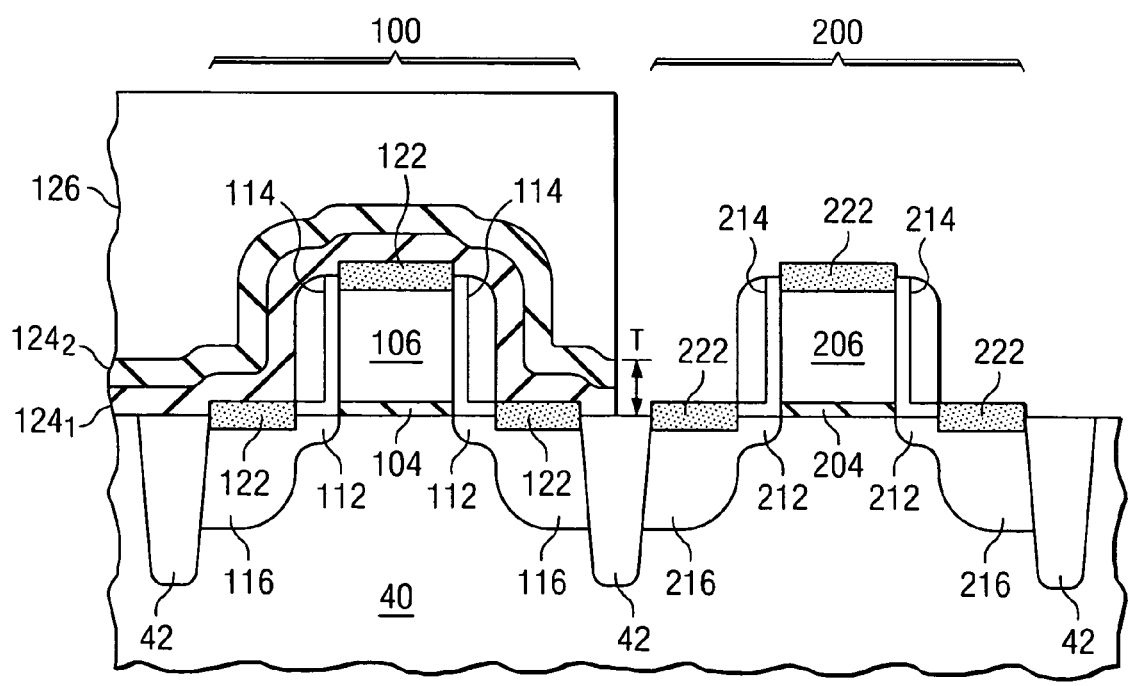

A barrier layer 124 is then formed, as illustrated in FIG. 7A. Although the barrier layer 124 preferably acts as a barrier for hydrogen, it may also function through other mechanisms, such as trapping. In the preferred embodiment, the barrier layer is an oxide layer comprising oxides such as silicon oxide, tetra ethyl ortho silicate (TEOS), CVD-oxide, and the like. In other embodiments, the barrier layer 124 comprises nitrided oxides. In yet other embodiments, the barrier layer 124 is a composite layer comprising two or more sub layers, and each sub layer may comprise one or more types of materials. FIG. 7B illustrates a barrier layer 124 having two sub layers $124_1$ and $124_2$, although more sub layers may be included. The preferred thickness T of the barrier layer 124 is between about 30 Å and about 500 Å. However, one skilled in the art will realize that the preferred thickness is determined by various factors, such as the material and the scale of the integrated circuits, and may have different values.

The barrier layer 124 may be formed using commonly used methods such as chemical vapor deposition (CVD), physical vapor deposition (PVD), and atomic-layer deposition (ALD). The barrier layer 124 is preferably selectively formed on the PMOS region 100 only, which is preferably achieved by blanket depositing the barrier layer 124, forming a mask 126 over the PMOS region 100, and removing the unmasked portion of the barrier layer 124 from region 200. The removal of the undesired portion of the barrier layer 124 can be performed using dry etching or wet etching using HF as an etchant. Alternatively, a mask (not shown) may be formed by covering the NMOS region 200 with a photo resist (not shown), blanket depositing the barrier layer 124, and removing the mask. In other embodiments, the barrier layer 124 may be left in region 200.

Figure 8:
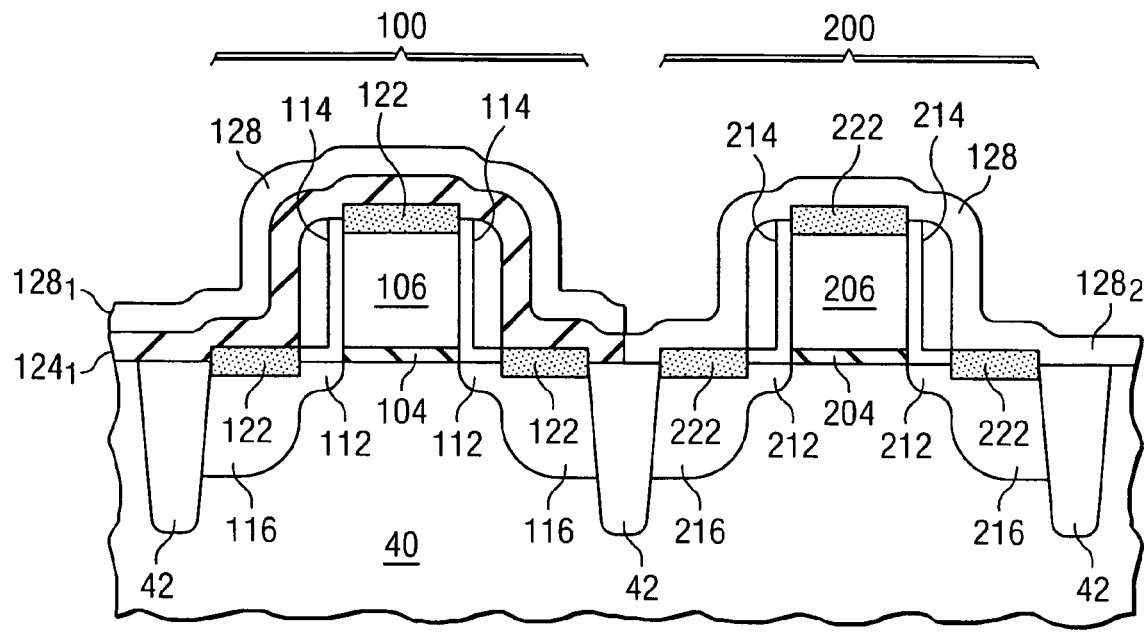

Next, as shown in FIG. 8, a stressed layer 128 is formed. Although this layer is preferably a contact etch stop layer (CESL) and is interchangeably referred to as CESL 128 throughout the description, it can be any stressed layer or layers, even if the layer does not perform an etch stop function. The stressed layer 128 may also be a composite layer comprising a CESL and other layers. Preferably, the stressed layer 128 has a thickness of between about 50 Å and about 1000 Å, and has an inherent stress of between about 0 Pa and about 2 GPa. In the preferred embodiment, the stressed layer 128 has a tensile stress and is formed of $Si_3N_4$. In other embodiments, the stressed layer 128 comprises materials such as oxynitrides, and/or other materials whose formation causes a hydrogen-containing by-product to be generated. In yet other embodiments, the stressed layer 128 may have a composite structure including a plurality of layers, such as a silicon nitride layer overlying a silicon oxide layer.

The stressed layer 128 is preferably formed using plasma enhanced CVD (PECVD), however, other commonly used methods such as low pressure CVD (LPCVD), atomic layer deposition (ALD), and the like can also be used. In the preferred embodiment wherein the stressed layer 128 comprises $Si_3N_4$, the formation is preferably performed in a chamber, in which gaseous precursors are introduced and a chemical reaction occurs. For example, silane ($SiH_4$) and ammonia ($NH_3$) are used to generate silicon nitride, which is deposited when reaction occurs. This type of reaction typically generates hydrogen or hydrogen-containing chemicals as by-products, which form bonds (Si—H) with silicon. Under high-temperature and negative gate-biased stress conditions, the holes, which are the majority carrier in PMOS devices, are generated from the induced inversion layer and react with materials containing a Si—H bond. As a result, Si—H bonds are broken, resulting in interface traps (Si dangling bonds). This causes negative bias time instability (NBTI) and reduces the lifetime of PMOS devices.

With a barrier layer 124 formed underlying the stressed layer 128, it is more difficult for hydrogen to travel through and form bonds with silicon in areas such as the gate electrode. This prevents or at least reduces the formation of Si—H bonds, and the subsequent formation of interface traps is prevented or reduced.

Two schemes may be used for the formation of the stressed layer 128. The first scheme is used in cases where cost is a bigger concern than performance. The second scheme creates MOS devices having optimized performance. However, cost is higher. In the first scheme, the PMOS region 100 and NMOS region 200 share a same stressed layer, preferably tensile stressed. The NMOS device benefits from the tensile stress generated in the channel region. The PMOS device, on the contrary, is adversely affected. However, due to the buffering of the barrier layer 124, less tensile stress is imparted to the channel region of the PMOS device, and thus the adverse effects are less severe. Since NMOS devices are more sensitive to stress in the channel regions than PMOS devices, the overall performance of the integrated circuit is improved. This embodiment makes a trade-off between performance and cost.

In the second scheme, the stressed layer 128 comprises a compressive stressed portion $128_1$ in region 100 and a tensile-stressed portion $128_2$ in region 200. More process steps and thus higher cost are involved, however. The portions $128_1$ and $128_2$ may be formed of different materials, or the same material formed under different forming conditions. In this case, additional photo masks are required to form portions $128_1$ and $128_2$ separately. However, the same masks that are used for the formation of the barrier layer 124 (as well as the photo masks for the formation of LDD and source/drain regions) may be reused, and the cost increase is thus limited.

Figure 9:
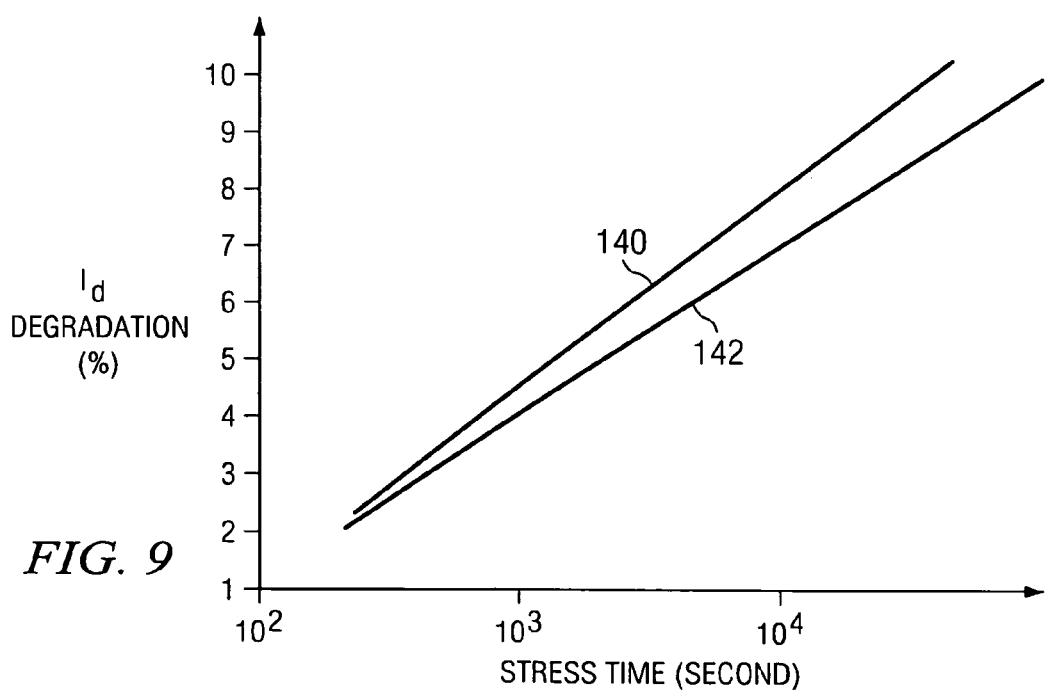
FIG. 9 illustrates the NBTI effects on PMOS devices with and without barrier layers, wherein PMOS device drive current is shown as a function of stress time.

The preferred PMOS device embodiments of the present invention have significantly improved reliability over prior art embodiments. FIG. 9 illustrates experiment results wherein device drive currents (in log scale) of PMOS devices are shown as functions of stress times. As is known in the art, NBTI causes the degradation of device drive current over time. Therefore, the degradation of device current can be used as a criteria to predict the lifetime of the PMOS devices. Line 140 shows results of prior art sample devices having silicon nitride CESLs without underlying barrier layers. Line 142 shows results of the preferred embodiments of the present invention, wherein a 1.4 nm nitrided oxide layer is formed underlying a silicon nitride CESL. All sample devices are biased at a gate voltage of −2 volts. It is observed that when stressed for 10,000 seconds, the prior art PMOS devices were degraded by about 8 percent while only about a 7 percent device drive current degradation was found on the preferred embodiments of the present invention. Although 7 percent and 8 percent appear to be a small difference, this difference can cause an about a three times negative bias temperature instability (NBTI) lifetime difference, hence a difference between pass and failure.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
    a PMOS device comprising:
        a first gate structure over a substrate;
        a first gate spacer on a sidewall of the first gate structure;
        a first source/drain region substantially aligned with a side edge of the first gate spacer;
        a barrier layer over at least a portion of the first gate structure, the first gate spacer, and the first source/drain region, wherein the barrier layer is a composite layer comprising two sub layers formed of different materials; and
        a first stressed contact etch stop layer having a compressive stress over the barrier layer; and
    an NMOS device comprising:
        a second gate structure over the substrate;
        a second gate spacer on a sidewall of the second gate structure;
        a second source/drain region substantially aligned with a side edge of the second gate spacer; and
        a second stressed contact etch stop layer having a tensile stress over at least a portion of the second gate structure, the second gate spacer, and the second source/drain region, wherein the barrier layer is substantially not located under the second stressed contact etch stop layer.

2. The semiconductor structure of claim 1, wherein the first stressed contact etch stop layer comprises silicon nitride.

3. The semiconductor structure of claim 1, wherein the tensile stress of the second stressed contact etch stop layer is less than about 2 GPa.

4. The semiconductor structure of claim 1, wherein the barrier layer comprises a material selected from the group consisting essentially of tetra ethyl ortho silicate (TEOS), oxide, and combinations thereof.

5. The semiconductor structure of claim 4, wherein the oxide is selected from the group consisting essentially of silicon oxide, oxynitrides, CVD-oxide, and combinations thereof.

6. The semiconductor structure of claim 1, wherein the barrier layer has a thickness of between about 30 Å and about 500 Å.

7. The semiconductor structure of claim 1 further comprising a silicide layer between the first source/drain region and the barrier layer.

8. A semiconductor structure comprising:
- a substrate comprising a first region and a second region; and
- a PMOS device in the first region, wherein the PMOS device comprises:
  - a first gate structure over the substrate in the first region;
  - a first gate spacer on a sidewall of the first gate structure;
  - a first source/drain region comprising a p-type impurity substantially aligned with a side edge of the first gate spacer;
  - an oxide layer over the first gate structure, the first gate spacer, and the first source/drain region; and
  - a first contact etch stop layer over the oxide layer and having a compressive stress; and
- an NMOS device in the second region, wherein the NMOS device comprises:
  - a second gate structure over the substrate;
  - a second gate spacer on a sidewall of the second gate structure;
  - a second source/drain region comprising an n-type impurity substantially aligned with a side edge of the second gate spacer; and
  - a second contact etch stop layer having a tensile stress over the second source/drain region, wherein the oxide layer is substantially not located in the second region.

9. The semiconductor structure of claim 8, wherein the first contact etch stop layer comprises silicon nitride.

* * * * *